United States Patent

Holland et al.

[11] Patent Number: 6,166,459
[45] Date of Patent: Dec. 26, 2000

[54] CAPACITOR MOUNTING ARRANGEMENT FOR MARX GENERATORS

[75] Inventors: Glenn E. Holland, Wheaton; Craig N. Boyer, Mitchellville, both of Md.; John F. Seely, Fairfax, Va.

[73] Assignee: The United States of America as represented by the Secretary of the Navy, Washington, D.C.

[21] Appl. No.: 09/215,499

[22] Filed: Oct. 29, 1998

[51] Int. Cl.[7] ................................................ H02M 3/18
[52] U.S. Cl. ......................... 307/109; 307/110; 361/328
[58] Field of Search .................................. 361/328, 293, 361/321.1, 312, 766, 782; 310/309, 71; 313/325, 568; 315/209 CD, 307; 307/106, 108, 109, 110

[56] References Cited

U.S. PATENT DOCUMENTS

| | | | |
|---|---|---|---|
| 3,248,574 | 4/1966 | Dyke et al. | 307/110 |
| 3,617,804 | 11/1971 | Paine | 315/326 |
| 4,038,587 | 7/1977 | Kaliebe | 361/321 |
| 4,298,902 | 11/1981 | Weigel et al. | 361/628 |
| 4,616,290 | 10/1986 | Watanabe et al. | 361/328 |
| 4,645,941 | 2/1987 | Nicolas | 307/110 |
| 4,720,766 | 1/1988 | Honda | 361/328 |
| 4,935,657 | 6/1990 | Lherm et al. | 310/309 |
| 5,311,067 | 5/1994 | Grothaus et al. | 307/108 |
| 5,382,835 | 1/1995 | Brandt et al. | 307/106 |
| 5,621,255 | 4/1997 | Leon et al. | 307/106 |
| 5,798,579 | 8/1998 | McPhee | 307/106 |
| 6,060,791 | 5/2000 | Goerz et al. | 307/110 |

*Primary Examiner*—Josie Ballato
*Assistant Examiner*—Roberto Rios
*Attorney, Agent, or Firm*—John J. Karasek; Charles J. Stockstill

[57] ABSTRACT

A mobile X-ray machine includes an improved Marx generator. The capacitors used in the Marx generator are disc capacitors each having opposed side surfaces having electrodes formed thereon and each including a insulative coating provided on the peripheral edge thereof. The capacitors are mounted in slots in a support structure and are supported by spring contact members located within the slots. The spring contact members include spring arms which engage the electrodes on the opposed side surfaces of the associated capacitor. The spring contact members also include support elements from which are suspended the spherical electrodes of spark-gap switches individually associated with each of the capacitors.

18 Claims, 5 Drawing Sheets

CAPACITOR MOUNTING ARRANGEMENT FOR MARX GENERATORS

Cross Reference To Related Application

This application is related to U.S. Application Ser. No. 09/162,150, filed Sep. 29,1998, now U.S. Pat. No. 6,064,718, the disclosure of which is hereby incorporated by reference.

This application is related to copending U.S. Application Ser. No. 08/738,927, filed Oct. 28, 1996, the disclosure of which is hereby incorporated by reference.

BACKGROUND OF THE INVENTION

1. Field of the Invention

The present invention relates to Marx generators and, more particularly, to an improved capacitor and associated capacitor mounting arrangement for such Marx generators.

2. Related Art

X-ray machines that generate X-rays from cold field emission of electrons from the cathode of an X-ray tube are commonly employed in pulsed shadowgraph radiographs. Pulsed or flash shadowgraph radiograph was developed in 1938 as a means for observing extremely rapid motion where the subject was obscured from observation with visible light or debris. To date, flash radiography remains the principal means of observing lensed implosions and ballistic impacts over microsecond and nanosecond time scales. The majority of these X-ray systems utilize the well known Marx generator which can be viewed as a distributed transmission-storage line, consisting of n-cascaded high-voltage ceramic disc capacitors, made of barium titanate, strontium titanate or any other suitable material that has a high dielectric constant. To produce X-rays, the Marx generator is coupled to a field emission X-ray tube either directly or by coaxial cables.

While previous Marx generator systems have performed satisfactorily, the high performance demands and high costs of such systems dictate that any substantial improvement in performance or reduction in cost can be quite important. In this regard, while the disc capacitors referred to above adequately serne their intended purposes, the present invention, as explained below, provides important advantages regarding the capacitors per se as well as the mountings therefor.

SUMMARY OF THE INVENTION

In accordance with the invention, an improved capacitor assembly is provided for use in a Marx generator. The novel assembly comprises both improved capacitors and an improved mounting arrangement for the capacitors. The invention enables the Marx capacitors to be thinner in construction while still being properly insulated and thus the overall capacitor assembly can be made smaller or, alternatively, more capacitors can be employed within the same space in the generator housing. In the latter case, the surge impedance of the generator is reduced, and a substantially increased X-ray output can be achieved with the additional capacitors, while maintaining system weight and substantially increasing system lifetime.

Accordingly to the invention, there is provided a capacitor assembly for use in a Marx generator, the capacitor assembly comprising a plurality of capacitors arranged serially and charged electrically in parallel, a spark-gap device associated with each of the capacitors, each of the spark-gap devices defining a spark gap and the capacitors being electrically connected to the spark-gap devices such that discharge of each of the capacitors causes a electrical spark across the spark gap of the associated spark-gap devices G1-G15, with G1- G14 shown in FIG. 3a and G15 shown in FIG. 6, the capacitors each comprising a disc member having flat side surfaces each having opposed an exposed electrode formed thereon and a peripheral edge having insulative coating thereon, and the assembly including a support means for supporting each of the capacitors, each of the support means including at least one flexible element engaging one of the side surfaces of the associated capacitor so as to make electrical contact with the electrode formed thereon.

Preferably, the support means comprises a pair of opposed, flexible contact elements respectively engaging the opposed flat surfaces of the disc member so as to make electrical contact with the electrodes formed on the flat surfaces. Advantageously, the flexible contact elements each comprise spring contact members mounted a support element. In a preferred implementation, the spring contact members each comprise a thin metal contact construction including a planar support portion and a U-shaped contact portion connected to the support portion and comprising first and second planar parallel arms extending parallel to the support portion, the first arm being joined to the support portion and the second arm defining a contact surface. The support elements of the flexible contact elements preferably include a flat surface affixed to the planar support portion of the contact members.

Preferably, the support elements each include affixing means for securing the support means to a part of one of the spark-gap devices. Advantageously, the spark-gap devices each comprise a pair of spaced spherical electrodes and the affixing means of each of the support elements comprises a screw element received in a screw hole in one of the spherical electrodes.

Other features and advantages of the invention will be set forth in, or apparent from, the following detailed description of the preferred embodiments of the invention.

DESCRIPTION OF THE PREFERRED EMBODIMENTS

Figure 1:
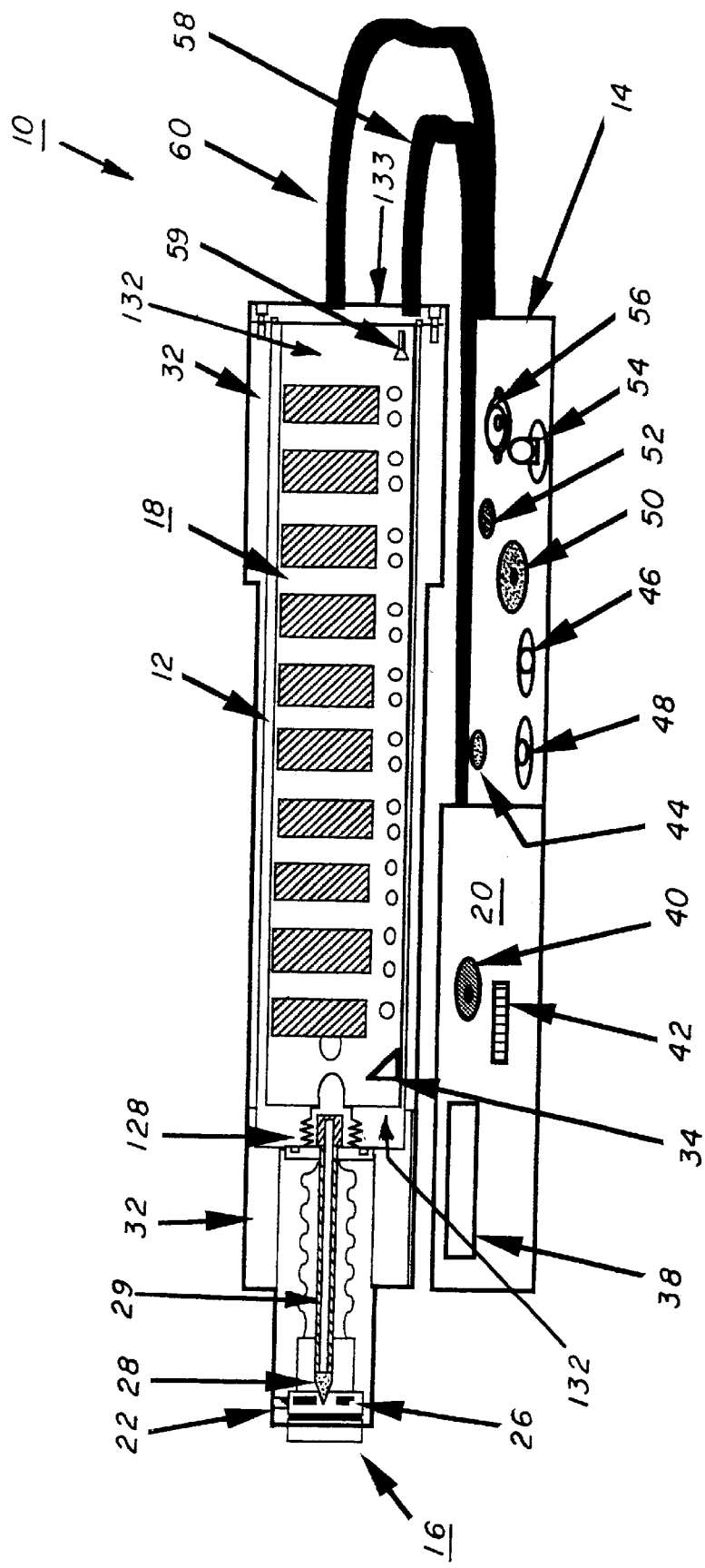
FIG. 1 is a schematic diagram of a mobile X-ray machine incorporating a Marx generator.

In copending, commonly assigned application Serial No. 08/738,927, the present inventors disclose a mobile X-ray machine which is of the type described in the introductory portion of this application and an embodiment of which is illustrated in FIG. 1. As shown in FIG. 1, the mobile X-ray machine, which is generally denoted 10, basically comprises two aluminum enclosures 32 and 14. Enclosure 32 houses a field emission X-ray tube assembly 16 and a Marx generator 18, and enclosure 14 houses control electronics 20.

Figure 2:
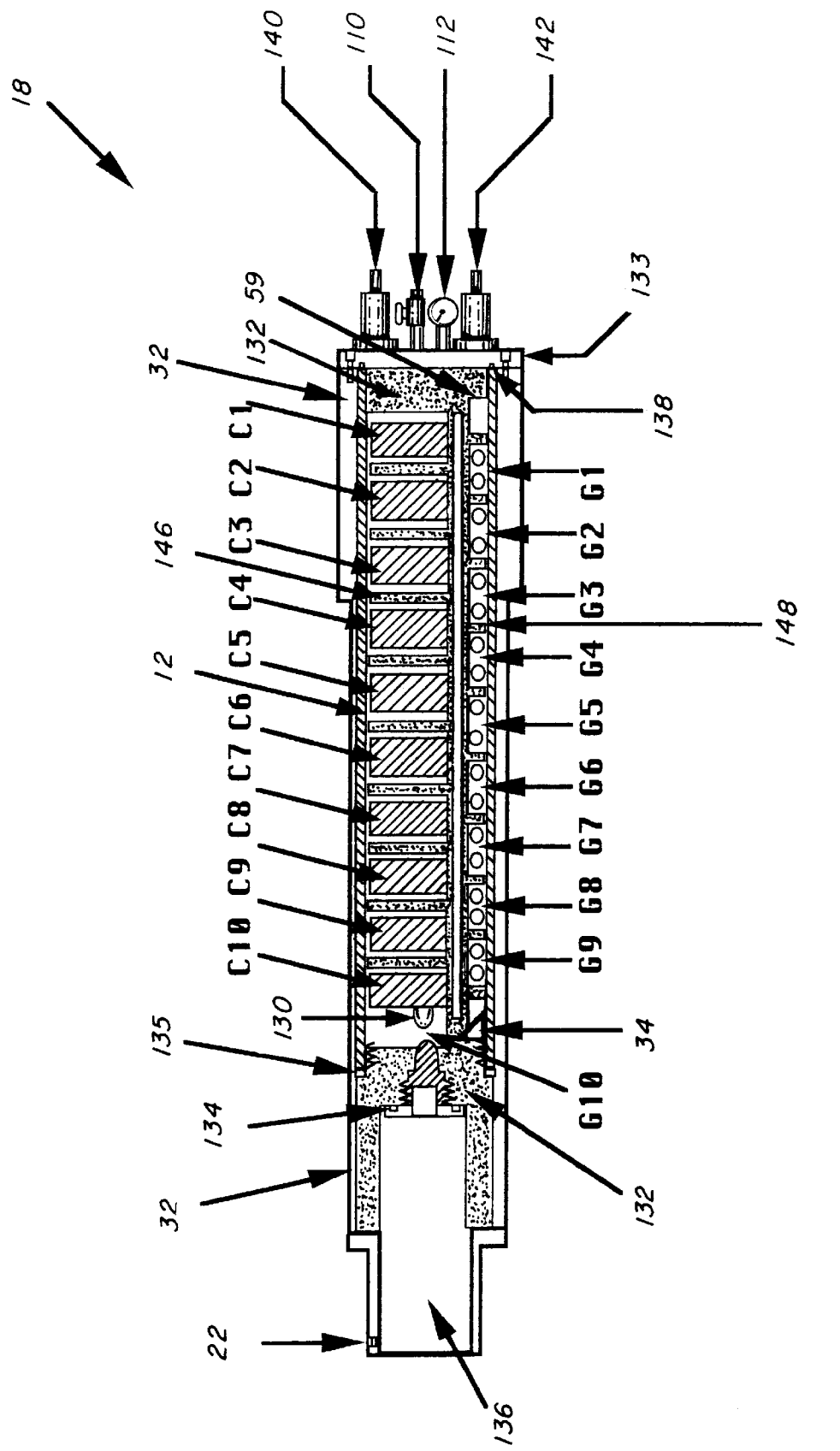
FIG. 2 is a schematic representation, partially broken away, of the overall Marx generator of FIG. 1.

Considering the Marx generator 18 in more detail, a plurality of ceramic disc capacitors C1 to C10 (FIG. 2) operate together with a plurality of spark-gap devices or switches G1 to G10 (FIG. 2). The capacitors C1 to C10 contained in the Marx generator 18 are charged to a high voltage (H.V.) in parallel via bleeder resistors in a resistor chain (not shown). The resistors of this chain are simply connected, in pairs, between the respective positive and negative terminals of adjacent capacitors. Each of the spark gap switches G1 to G10 consists of two closely spaced spherical electrodes. The spark gap switches are arranged so that each charged capacitor C1 to C10 in the Marx generator 18 is isolated from all other capacitors via the bleeder resistors. The spark gap switches G1 to G10 are mounted along a common optical axis (not shown) together with an ultraviolet photoionization device or source 59 (FIGS. 1 and 2). Source 59 is connected to the control electronics 20 and is mounted within the Marx generator 18 in close proximity to the first spark gap switch G1. The control electronics 20, which form no part of the present invention, are described in U.S. Application Ser. No. 08/738,927, referred to above.

Triggering of the Marx generator 18 begins with the control electronics 20 which initiates a high voltage trigger pulse which triggers ultraviolet photoionization source 22 by way of a connection path 58. In response, the U.V. photoionization source 59 emits a large flash of hard U.V. radiation. The hard U.V. radiation emitted from device 59 photoionizes spark gap G1, and the closure of this switch places the first capacitor in the Marx generator C1 in series with the second capacitor C2 in the generator 18, thereby doubling the voltage across the second spark gap switch G2. The increased voltage stress across the second spark gap together with the hard ultraviolet illumination it receives from the closure of the first spark gap switch G1 causes the second spark gap to break down quickly. This process continues at an accelerating rate until all capacitors C1–C10 in the Marx generator 18 are fully connected in series. The full Marx voltage now appears across switch G10 which is connected to a power feedthrough device 26.

Briefly considering the X-ray tube assembly 16, power feedthrough device 128 transmits the H.V. output of the Marx capacitors C1 to C10 to the anode 28 of the X-ray tube 16, via anode tube 29. The X-ray tube assembly 16 is held within the enclosure 12 by a clamping arrangement 32. When the high voltage (H.V.) pulse arrives at the anode 28 of the X-ray tube 16, it establishes a large potential gradient in the anode-cathode gap. This gradient produces an intense electric field at the tips of the small metal whiskers (not shown) which are present on the surface of the cathode mesh 26. These whiskers are heated by the passage of the field emission electron current, and vaporize, thereby creating a neutral plasma which acts as a virtual cathode capable of supporting a much larger current. Electrons emitted from the expanding virtual cathode are accelerated by the electric field in the anode-cathode gap and eventually collide with the anode 28 creating X-rays by the usual Bremmstrahlung and line radiation processes. Electrons continue to cross the anode-cathode gap until the X-ray tube impedance drops to a few ohms and effectively shorts the tube.

Referring to FIG. 2, a cross sectional or cut-away view of enclosure 12 is shown which illustrates the internally housed components primarily related to the Marx generator 10. Enclosure 32 includes an inlet valve 110 and a pressure measuring inlet 112 connected to a pressurized cylinder (FIG. 2) housed within a chamber 12 (FIG. 1). Chamber 32 is defined by outer conducting (aluminum) walls which fit around an acrylic insulating cylinder or chamber 12.

In the embodiment illustrated in FIG. 2, the Marx capacitors C1 to C10 and spark-gap devices G1 to G10 are mounted on a polycarbonate insulating "spine" 132 which is preferably formed by machining a polycarbonate rod into a spine configuration. The spine 132 includes a chamber (not shown) formed therein at one end thereof into which a pressurized gas introduced through valve 110 for monitoring by pressure meter 112. The other end of spine 132 abuts very closely to the power feed through element 128 shown in FIG. 1.

As indicated above in connection with FIG. 1, the power feed through element 128 provides electrical path between the final spark-gap device G10 and the x-ray tube 16. In particular, when screw threads of power feed through element 128 are screwed into insulating spine 132, Marx generator 18 is caused to be connected to anode 28 of x-ray tube 16. As indicated in FIG. 2, the insulating spine 132 and acrylic cylinder 12 abut up against an O-ring pressurized seal 134. Seal 134, in cooperation with the aluminum housing 32, provides or defines an entrance passage 136 into which the X-ray tube 16 of FIG. 1 is received. The aluminum housing or enclosure 32 and acrylic cylinder 12 mate with a second pressurized O-ring seal 138 at the end closure 133 for housing 32 to which is connected a high voltage connector 140.

In operation, the chamber defined by spine 132 within acrylic cylinder 12 is pumped to a vacuum pressure of approximately $10^{-3}$ torr and back filled with dry nitrogen gas to a pressure about 25 to 30 psiA (pounds per square inch absolute). The 2 atmosphere pressure of the nitrogen gas enables spark gap electrodes or devices G1 to G10 to be separated by a desired spacing (e.g., about 1 mm).

As shown in FIG. 2, capacitors C1 to C10 are physically separated from each other by barriers 146 formed by insulating spine 132. In this embodiment, capacitors C1 to C10 are encased or "potted" with epoxy (which is the manner in which they are received from the factory) and include tapped holes and cooperating connectors (not shown) which project through the epoxy and by which electrical connections to the capacitors are made. Barriers 146 form slots which extend across the full width of spine 132 and which permit some lateral "floating" movement of the respective capacitors C1 to C10 received in these slots. In practice, spine 132 is made relatively long so as to accommodate the ten capacitors C1 to C10 and some undesirable bowing of the spine 132 can occur. Spark-gap devices G1 to G 10 are similarly separated from each other by barriers 148 which, again, are part insulating spine 132.

Referring to FIG. 3, 3a, 4, 5 and 5a, a preferred embodiment of the capacitors and capacitor assemblies of the present invention is shown. A ceramic capacitor, denoted 100 and corresponding. for example, to one of capacitors C1 to C15 (FIG. 3a) comprises a flat disc 100. Disc 100 has opposed flat sides having conductive electrodes 104 formed thereon and a peripheral edge covered by an insulation coating or material 106. The electrodes 104 are conventional and are provided at the factory when the capacitor is made. However, in this embodiment, the capacitors are received in a "naked" state, i.e., without the epoxy encasement normally provided. Insulation coating 106 mitigates any sharp protrusions from the edge of the electroded surfaces of ceramic disc 100 and, in this regard, eliminates all of the microscopic "whiskers" at this edge which otherwise could emit an electron to start a cascade effect resulting in a high voltage breakdown. The provision of insulation material 106 only at the peripheral edge contrasts with the capacitors previously used, and described above, wherein each capacitor is completely embedded or encased in epoxy. The coating 106 is applied to the edge of the "naked" capacitor while the capacitor is rotated (typically at about 25 rpm.), and with the capacitor disposed perpendicular to the ground. With this technique, the centrifugal force produced forms a nice uniform bead at the disc edge.

Figure 3:
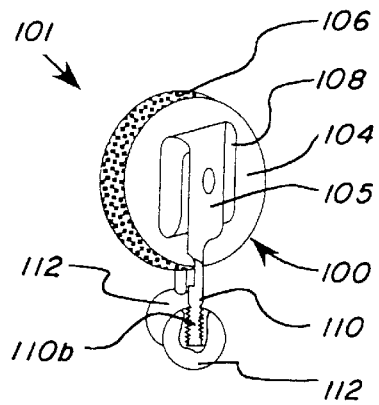
FIGS. 3, 3a, 4, 5 and 5a are a perspective view, an end elevational view and a side elevational view, respectively, of a capacitor and associated capacitor mounting assembly in accordance with a preferred embodiment of the invention.
Figure 3A:
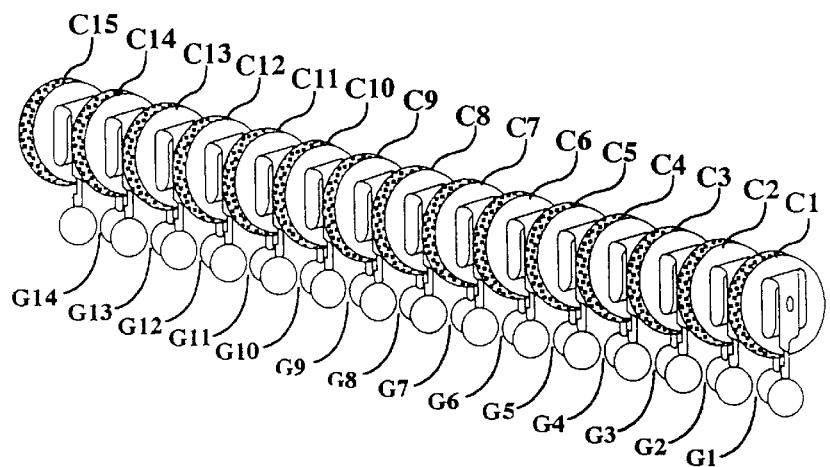
Figure 4:
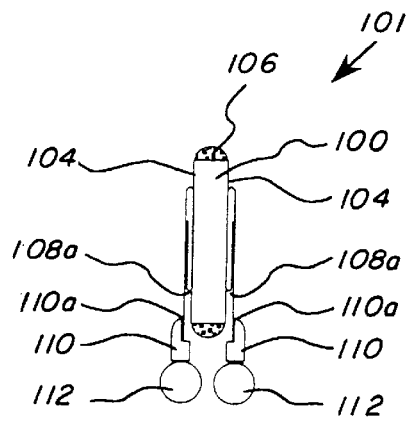
Figure 5:
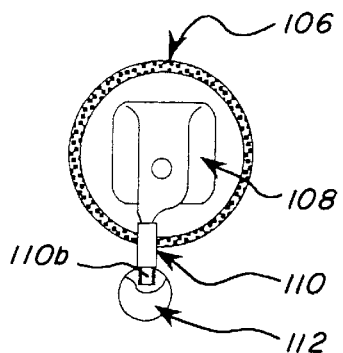
Figure 5A:
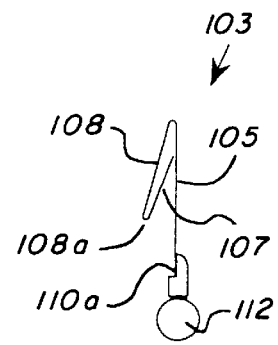

Each capacitor 100 is supported by a pair of spring clamps or contacts 108. Each clamp 108 is formed by very thin metal (e.g., a 0.010" thick, ½ hard beryllium-copper alloy) which is bent or folded as shown in FIG. 4 to form an inner U-shaped portion 108a having a flat outer wall which contacts the flat electrode 104 side surface of the capacitor 100. The contact tabs provided by the two opposed clamps 108 or contacts form plus and minus electrode assemblies for the capacitor. The spring clamps 108 are each affixed to a spark-gap mount 110 (formed in a typical, non-limiting implementation by, e.g., a 0.125 inch diameter brass rod). Mount 110 has a flat side 110a to which a flat bottom leg of an associated clamp 108 is welded or otherwise affixed, and a screw threaded end 110b which, as indicated in FIGS. 3 and 5, screws into an associated spark-gap spherical electrode 112, corresponding, for example, to one of the electrodes of spark-gap devices G1 to G14. The spherical electrodes 112 are supported in spaced relation as can best be seen in FIGS. 3a and 4.

Figure 6:
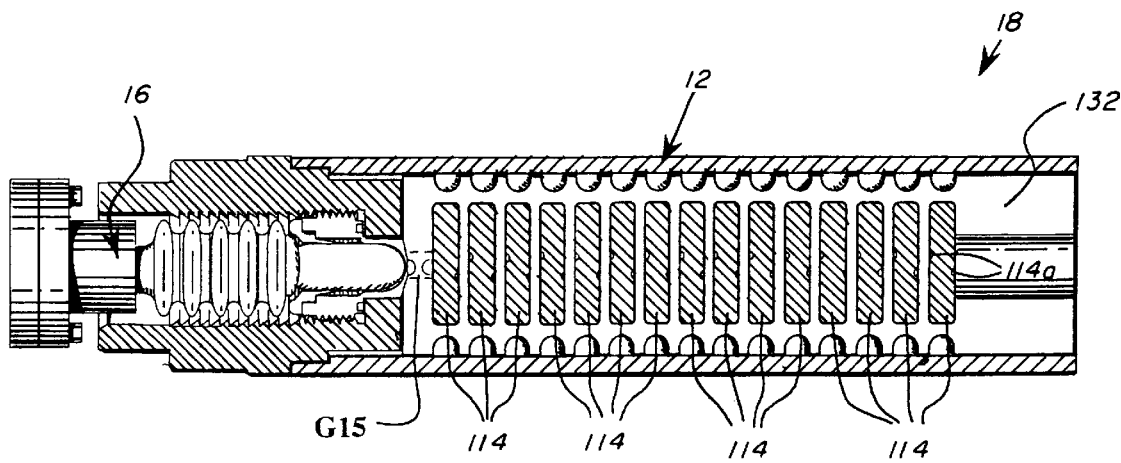
FIG. 6 is a top plan view of an alternative embodiment of the Marx generator of FIG. 2, showing the capacitor mounting pockets or slots.

Referring to FIG. 6, a top plan view of a preferred embodiment of the spine 132 is provided, showing the mounting arrangement for the Marx capacitors. The housing 32 also supports an X-ray tube 16 generally corresponding to that shown in FIG. 1 and, although the overall configuration and geometry is somewhat different from that shown in FIG. 2 (which is, of course, a longitudinal cross section), the basic operation is the same and the only important differences, insofar as the present invention is concerned, involve the manner in which the capacitors are mounted. In this regard, a plurality of pockets or slots 114 are provided in spine 132 into each of which a mounting assembly corresponding to that shown in FIGS. 3 to 5 is inserted. The slots 114 are sized to fit the associated capacitors and, as illustrated, do not extend fully across the spine 132. Although the specific number of slots 114 is not critical, it is important to appreciate that the mounting of the arrangement of the present invention as illustrated in FIG. 6 enables fifteen capacitors to be mounted within the same space as was required for the ten capacitors C1 to C10 of the embodiment of FIG. 2. The bottoms of slots 114 include staggered holes 114a which can be partially seen in FIG. 6 and through which the mounts 110 for the spherical electrodes 112 extend so that the electrodes 112 are suspended in spaced relation beneath the portion of the spine 132 defining slots 114. It is noted that the capacitor assembly 101 described above also eliminates the need for the clamping diodes used in the embodiment disclosed in the aforementioned application Ser. No. 08/738,927.

Figure 7:
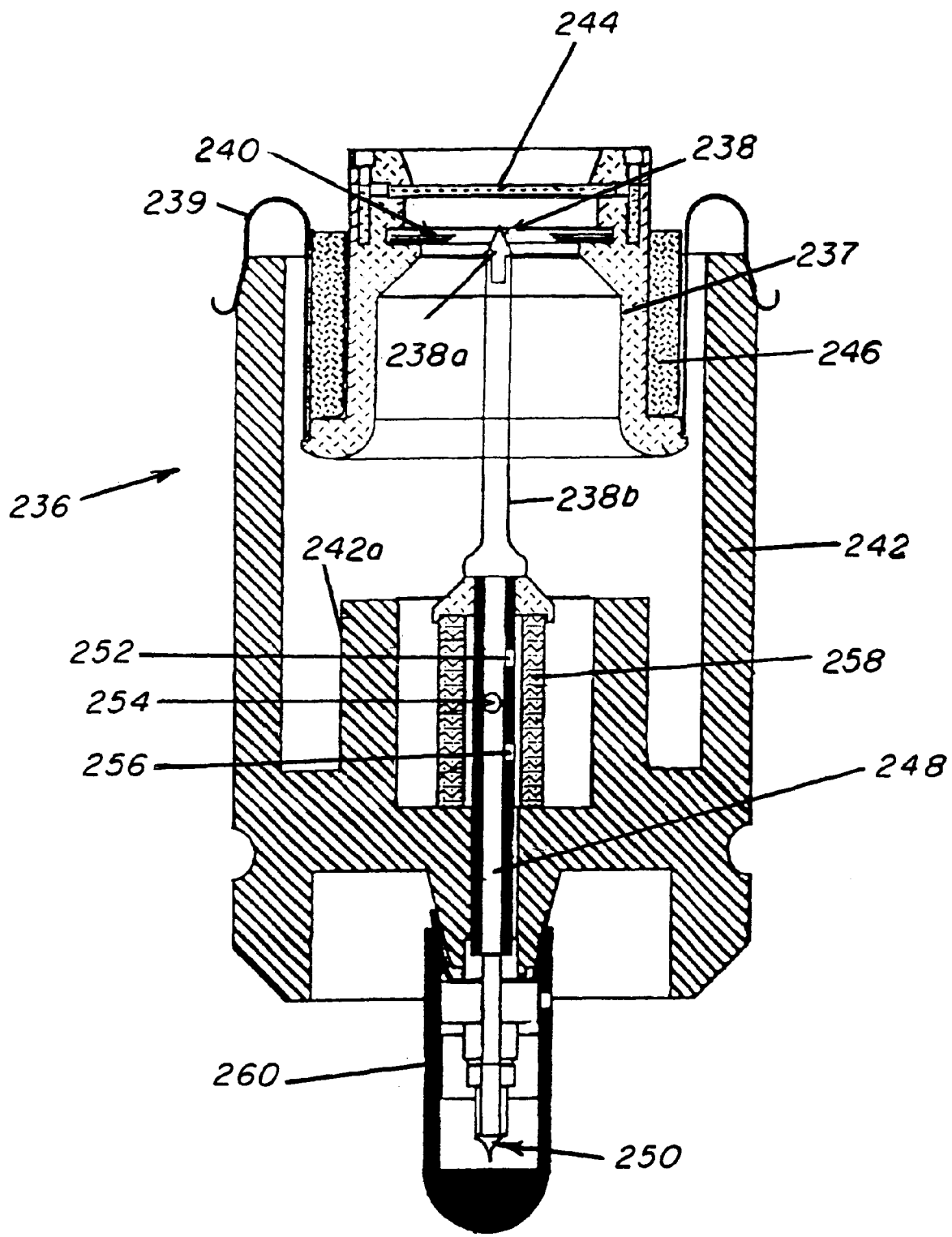
FIG. 7 is a cross-sectional view of a field emission tube in accordance with a preferred embodiment of the invention.

Referring to FIG. 7, there is shown a field emission tube 236 in accordance with a preferred embodiment of the invention. Field emission tube 236 is generally of the type comprised of a geometric arrangement of an anode 238 and a cathode 240 derived from the well known "Siemens-tube" configuration. The field emission tube 236 includes an anode 238 which has a conical copper/tungsten anode tip 238a and an elongated anode body 238b, and a perforated cathode 240 preferably punched out from or otherwise formed by a metal mesh or foil such as copper, BeCu, Ti, stainless steel, Zr, or other suitable metal. Anode 238 and cathode 240 are mounted within a generally cylindrical support member 237 supported by a sealing element or member 239, preferably made of Kovar, at one end of a ceramic housing 242. A vacuum window 244, preferably made of aluminum or the like, is mounted at the distal end of support member 237 in spaced parallel relation to cathode 240. The vacuum window 244 is preferably a 0.1 mm thick aluminum x-ray window. As illustrated, the interior of the ceramic housing 242 has a convoluted shape at the bottom of the housing provided by an inwardly spaced wall 242a This convoluted shape provides an extended spark creep path which extends along the inner surface of the outer wall of housing 242, the outer surface of the inner wall 242a and the inner surface of the inner wall 242a and thus assists in reducing surface tracking.

The radiation produced from the field emission tube 236 is only permitted to escape along the longitudinal axis thereof and, as a result of the provision of conical anode tip 238a, the emitting area is about 1–2 mm in diameter. Application of a high voltage across the anode-cathode gap of the field emission tube 236 under good vacuum produces an intense electric field between the wires in the mesh of the cathode 240 and the surface of conical shaped anode 238. This electric field extracts electrons from the cathode 240 by the process of cold field emission. The electrons accelerate from the cathode 240 towards the anode 238 where the electrons collide and produce Bremmstrahlung and K-line radiation in the X-ray wavelength range. This radiation continues until the plasma produced at the cathode 240 crosses the gap and shorts out the tube 236. Plasma closure in one preferred embodiment of the field emission tube 236 sets the X-ray pulse width at about 50 nanoseconds.

The X-rays pass through the vacuum window 244 and travel toward the desired target. However, all of the radiation does not travel toward the vacuum window 244. Some stray radiation travels in a direction perpendicular to the longitudinal tube axis. A lead ring or annulus 246 is mounted in surrounding relation around the support member 237 supported within the ceramic housing 242 and extends over an upper portion of the length of anode 238 so as to attenuate stray radiation. It is noted that placing the lead ring 246 within the ceramic housing 242, as opposed to outside of a ceramic housing as in prior art devices, permits the use of a smaller diameter and thus lighter lead ring and contributes to the overall reduction in weight of the field emission tube 236 as compared with such devices.

An anode tube 248 provides an electrical connection between the anode 238 and an external power supply (not shown). The anode tube 248 preferably comprises a tubular member having a typical outer diameter of 0.24 inches and a typical inner diameter of 0.125 inches. The anode tube 248 is also used during the evacuation of the field emission tube 236, together with a vacuum pinch-off element 250 located at the opposite end of field emission tube 236 from anode 238. The field emission tube 236 is evacuated through the center of the anode tube 248. In this operation, a vacuum source (not shown) is attached to the vacuum pinch-off element 250. The vacuum pinch-off element 250 is replaceable and allows the field emission tube 236 to be opened for maintenance and then resealed. In a preferred embodiment, the vacuum pinch-off element 250 is formed from a tube of soft copper or other metal, in contrast with the glass pinch-off elements of the prior art. The provision of such a metal pinch-off element contributes to the reusability of the field emission tube.

During the vacuum evacuation process, gasses inside the field emission tube 236 travel through a series of holes 252, 254 and 256 formed in the side walls of anode tube 248 and exit through the vacuum pinch-off element 250. Holes 252, 254 and 256 are preferably arranged in a spiral pattern so as not to unduly weaken the walls of anode tube 248. Prior to the evacuation process, all of the components within the ceramic housing 242 are cleaned and vapor degreased. In one preferred example, the field emission tube 236 was pumped down to $4 \times 10^{-8}$ torr and baked to promote de-absorption of wall contaminates. The contaminates on the surfaces of anode 238 and cathode 240 can further be removed by repeatably discharging the field emission tube 236 during the evacuation process.

In the illustrated embodiment, a cylinder of getter material 258 is disposed inwardly of inner wall 242a of the housing 242, in adjacent. surrounding relation to the anode tube 248, and in the vicinity of holes 252, 254 and 256. Getter material 258 acts to bind any gasses not evacuated out through the vacuum pinch-off element 250.

The vacuum pinch-off element 250 is protected by a cap 260. The cap 260 also serves as an electrical contact between the anode tube 248 and the external power supply (not shown).

It will be appreciated that field emission tube 236 is intended to replace x-ray tube 16 of FIG. 1 and FIG. 6 and would be connected to, and supported by, the housing of FIGS. 1 and 6 in the same way as tubes 16. In exemplary embodiment, the field emission tube 236 is preferably powered by a 200 kV Marx generator of the type shown in FIG. 1 and delivers an exemplary total integrated x-ray dose of about 94 milliroentgens at 30 cm with a repeatability of ±2%.

Although the invention has been described in detail with respect to preferred embodiments thereof, it will be apparent to those skilled in the art that variations and modifications can be effected in these embodiments without departing from the spirit and scope of the invention.

We claim:

1. A capacitor assembly for use in a Marx generator, said capacitor assembly comprising a plurality of capacitors arranged physically in serial spaced relation and electrically connected in parallel, a spark-gap device associated with each of said capacitors, each of said spark-gap devices defining a spark gap and said capacitors being electrically connected to said spark-gap devices such that discharge of each of said capacitors causes an electrical spark across the spark gap of the associated spark-gap device, said capacitors each comprising a disc member having flat side surfaces each having an exposed electrode formed thereon, said disc member also having a peripheral edge and having insulative coating confined to said peripheral edge, and said assembly including a support for each of said capacitors, each support including at least one flexible element engaging one side of said side surfaces of the associated capacitor so as to make electrical contact with the electrode formed thereon.

2. A capacitor assembly as claimed in claim 1 wherein each said support comprises a pair of opposed, flexible contact elements respectively engaging said opposed flat surfaces of said disc member so as to make electrical contact with the electrodes formed on said flat surfaces.

3. A capacitor assembly as claimed in claim 2 wherein said flexible contact elements each comprise spring contact members mounted a support element.

4. A capacitor assembly as claimed in claim 3 wherein said spring contact members each comprise a thin metal contact construction including a planar support portion and a U-shaped contact portion connected to said support portion and comprising first and second planar parallel arms extending parallel to said support portion, said first arm being joined to said support portion and said second arm defining a contact surface.

5. A capacitor assembly as claimed in claim 4 wherein said support element includes a flat surface affixed to said planar support portion.

6. A capacitor assembly as claimed in claim 3 wherein said support elements each include affixing means for securing said support means to a part of one of said spark-gap devices.

7. A capacitor assembly as claimed in claim 6 wherein said spark-gap devices each comprise a pair of spaced spherical electrodes and wherein the affixing means of each of said support elements comprises a screw element received in a screw hole in one of said spherical electrodes.

8. A Marx generator including a capacitor assembly comprising a housing, plurality of capacitors electrically connected in parallel within said housing, a plurality of spark-gap devices individually connected to respective ones of said capacitors within said housing, said capacitors each comprising a disc capacitor having exposed electrodes on opposed flat surfaces and a peripheral edge having an insulative coating thereon and said housing including a support member forming a longitudinal row of spaced pockets in which said disc capacitors are received, and spring contact means for resiliently supporting said disc capacitors in said pockets.

9. A capacitor assembly as claimed in claim 8 wherein said spring contact means comprises a pair of opposed, flexible contact elements respectively engaging said opposed flat surfaces of a respective one of said disc capacitors so as to make contact with the electrodes formed on said flat surfaces.

10. A capacitor assembly as claimed in claim 9 wherein said flexible contact elements each comprise spring contact members mounted a support element.

11. A capacitor assembly as claimed in claim 10 wherein said spring contact members each comprise a thin metal contact construction including a planar support portion and a U-shaped contact portion connected to said support portion and comprising first and second planar parallel arms extending parallel to said support portion, said first arm being joined to said support portion and said second arm defining a contact surface.

12. A capacitor assembly as claimed in claim 11 wherein said support element includes a flat surface affixed to said planar support portion.

13. A capacitor assembly as claimed in claim 10 wherein said support elements each include affixing means for securing said spring contact members to a part of one of said spark-gap devices.

14. A capacitor assembly as claimed in claim 13 wherein said spark-gap devices each comprise pair of spaced spherical electrodes and wherein the affixing means of each of said support elements comprises a screw element received in a screw hole in one of said spherical electrodes.

15. A capacitor assembly for use in a Marx generator, said capacitor assembly comprising a plurality of capacitors arranged physically in serial, spaced relation and electrically in parallel, a spark-gap device associated with each of said capacitors, each of said spark-gap devices comprising a pair of spherical spark gap elements defining a spark gap therebetween, said capacitors each comprising a disc member having flat side surfaces each having an exposed electrode formed thereon and a peripheral edge having insulative coating thereon, and said assembly including a support means for supporting each of said capacitors, said support means for each of said capacitors being spaced from and electrically unconnected to the support means of each of the other capacitors, and each said support means comprising a pair of opposed spring contact and support elements each including, at one end thereof, a flexible contact portion in electrical contact with a respective one of the electrodes formed on said flat surfaces of the disc member and, at the other end thereof, a support portion connected to, and supporting, a respective one of said pair of spherical spark gap elements.

16. A capacitor assembly as claimed in claim 15 wherein said contact portion of each said flexible contact elements comprises a spring contact member and said support portion comprises a support element affixed to a respective spring contact member.

17. A capacitor assembly as claimed in claim 16, wherein said spring contact members each comprise a thin metal contact construction including a planar support part and a U-shaped contact part connected to said planar support part and comprising first and second planar parallel arms extending parallel to said support part, said first arm being joined to said support part and said second arm defining a contact surface.

18. A capacitor assembly as claimed in claim 17 wherein said support element includes a flat surface affixed to said planar support portion.

\* \* \* \* \*